United States Patent
Basol

(10) Patent No.: US 7,374,963 B2
(45) Date of Patent: May 20, 2008

(54) TECHNIQUE AND APPARATUS FOR DEPOSITING THIN LAYERS OF SEMICONDUCTORS FOR SOLAR CELL FABRICATION

(75) Inventor: Bulent M. Basol, Manhattan Beach, CA (US)

(73) Assignee: Solopower, Inc., San Jose, CA (US)

( * ) Notice: Subject to any disclaimer, the term of this patent is extended or adjusted under 35 U.S.C. 154(b) by 141 days.

(21) Appl. No.: 11/081,308

(22) Filed: Mar. 15, 2005

(65) Prior Publication Data

US 2005/0202589 A1    Sep. 15, 2005

Related U.S. Application Data

(60) Provisional application No. 60/552,736, filed on Mar. 15, 2004.

(51) Int. Cl.
*H01L 21/00* (2006.01)
(52) U.S. Cl. .................. 438/95; 136/264; 257/E21.068
(58) Field of Classification Search ................ 136/264; 257/E21.068; 438/95
See application file for complete search history.

(56) References Cited

U.S. PATENT DOCUMENTS

| | | | |
|---|---|---|---|
| 4,581,108 A | 4/1986 | Kapur | |
| 4,798,660 A | 1/1989 | Ermer et al. | |
| 5,436,204 A * | 7/1995 | Albin et al. | 438/488 |
| 5,489,372 A | 2/1996 | Hirano | |
| 5,501,786 A | 3/1996 | Gremion | |
| 5,567,469 A | 10/1996 | Wada | |
| 5,695,627 A | 12/1997 | Nakazawa | |
| 5,730,852 A | 3/1998 | Bhattacharya | |
| 5,804,054 A | 9/1998 | Bhattacharya | |
| 5,871,630 A | 2/1999 | Bhattacharya | |
| 6,048,442 A | 4/2000 | Kushiya | |
| 6,092,669 A | 7/2000 | Kushiya | |

OTHER PUBLICATIONS

Hansen, P., "Cu-Ga Copper Gallium",, Constitution of Binary Alloys, 2nd ed., McGraw-Hill Book Co., pp. pp. 582-584, (1958).
Kapur, VK., et all., , Low Cost Methods for the Production of Semiconductor Films for CuInSe2/CdS Solar Cells, Solar Cells, Elsevier Sequoia (Netherlands), pp. pp. 65-72, (1987).

(Continued)

*Primary Examiner*—Asok Kumar Sarkar
(74) *Attorney, Agent, or Firm*—Pillsbury, Winthrop, Shaw, Pittman LLP

(57) ABSTRACT

The present invention advantageously provides for, in different embodiments, low-cost deposition techniques to form high-quality, dense, well-adhering Group IBIIIAVIA compound thin films with macro-scale as well as micro-scale compositional uniformities. In one embodiment, there is provided a method of growing a Group IBIIIAVIA semiconductor layer on a base, and includes the steps of depositing on the base a film of Group IB material and at least one layer of Group IIIA material, intermixing the film of Group IB material and the at least one layer of Group IIIA material to form an intermixed layer, and forming over the intermixed layer a metallic film comprising at least one of a Group IIIA material sub-layer and a Group IB material sub-layer. Other embodiments are also described.

35 Claims, 7 Drawing Sheets

OTHER PUBLICATIONS

Kapur, VK., et al., "Low Cost Thick Film Chalcopyrite Solar Cells",, IEEE, pp. pp. 1429-1432, (1985).

Subramanian, PR, et al.,, "The Cu-In (Copper-Indium) System",, Bulletin of Alloy Phase Diagrams, vol. 10 (No. 5), pp. pp. 554-568, (1989).

International Search Report issued Mar. 17, 2007 in corresponding PCT application No.: PCT/US2005/08631.

Abou-Elfotouh, FA, et al., "Studies of the Electrical and Interface Properties of the Metal Contacts to $CuInSe_2$ Single Crystals", *J. Vac. Sci. Technol. A.*, 8(4), Jul./Aug. 1990, pp. 3251-3254.

Bhattacharya, R.N., et al., "$CuIn_{1-x}Ga_xSe_2$-based Photovoltaic Cells from Electrodeposited Precursor Films", *Solar Energy Mats & Solar Cells*, vol. 76, 2003, pp. 331-337.

Binsma, J.J., et al., "Preparation of Thin $CuInS_2$ Films via a Two Stage Process", *Thin Solid Films*, 97, 1982, pp. 237-243.

Calixto, M.E., et al., "$CuInSe_2$ Thin Films Formed by Selenization of Cu-In Precursors", *J. of Mats. Sci.*, 33, 1998, pp. 339-345.

Dey, S., et al., "Platinum Group Metal Chalcogenides", *Platinum Metals Rev.*, 48(1), 2004, pp. 16-29.

Fernandez, et al., "Electrodeposited and Selenized ($CuInSe_2$) (CIS) Thin Films for Photovoltaic Applications", *Solar Energy Materials and Solar Cells*, 52, 1998, pp. 423-431.

Friedfeld, R., et al., "Electrodeposition of $CuIn_xGa_{1-x}Se_2$ Thin Films", *Solar Energy Mats. & Solar Cells*, 58, 1999, pp. 375-385.

Fritz, H.P., et al., "A New Electrochemical Method for Selenization of Stacked CuIn Layers and Preparation of $CuInSe_2$ by Thermal Annealing", *Thin Solid Films*, 247, 1994, pp. 129-133.

Ganchev, M., et al., "Preparation of $Cu(In,Ga)Se_2$ Layers by Selenization of Electrodeposited Cu-In-Ga Precursors", *Thin Solid Films*, 511-512, 2006, pp. 325-327.

Ghosh, B., et al., "A Novel Back-Contacting Technology for $CuInSe_2$ Thin Films", *Semiconduct. Sci. Tech.*, 11, 1996, pp. 1358-1362.

Grindle, S.P., et al., "Preparation and Properties of $CuInS_2$ Think Films Produced by Exposing rf-Sputtered Cu-In Films to an $H_2S$ Atmosphere", *Appl. Phys. Lett*, 35(1) Jul. 1, 1979, pp. 24-26.

Guillen, C., et al., "New Approaches to Obtain $CuIn_{1-x}Ga_xSe_2$ Thin Films by Combining Electrodeposited and Evaporated Precursors", *Thin Solid Films*, 323, 1998, pp. 93-98.

Guillen, C., et al., "$CuInSe_2$ Thin Films Obtained by a Novel Electrodeposition and Sputtering Combined Method," *Vacuum*, 58, 2000, pp. 594-601.

Gupta, A., et al., "$CuInS_2$ Films Prepared by Sulfurization of Electroless Deposited Cu-In Alloy", *Solar Energy Mats.*, 18, 1988, pp. 1-8.

Huang, C.J., et al., "Formation of $CuInSe_2$ Thin Films on Flexible Substrates by Electrodeposition (ED) Technique", *Solar Energy Mats. & Solar Cells*, 82, 2004, pp. 553-565.

Kadam, A., et al., "Study of Molybdenum Back Contact Layer to Achieve Adherent and Efficient CIGS2 Absorber Thin-Film Solar Cells", *J. Vac. Sci. Tech. A.*, 23(4), Jul./Aug. 2005, pp. 1197-1201.

Kampmann, A., et al., "Electrodeposition of CIGS on Metal Substrates", *Mat. Res. Soc. Symp. Proc.*, 763, 2003, pp. B8.5.1-B8.5.6.

Kim, et al., "Preparation of $CuInSe_2$ Thin Films Using Electrodeposited In/Cu Metallic Layer", *First WCPEC*, Dec. 5-9, 1994, Hawaii, *IEEE*, pp. 202-205.

Kumar, et al., "Properties of $CuInSe_2$ Films Prepared by the Rapid Thermal Annealing Technique", *Thin Solid Films*, 223, 1993, pp. 109-113.

Lokhande, C., et al., "Preparation of $CuInSe_2$ and $CuInS_2$ Films by Reactive Annealing in $H_2Se_2$ or $H_2S$", *Solar Cells,*, 21, 1987, pp. 215-224.

Malmstrom, J., et al., "Enhanced Back Reflectance and Quantum Efficiency in $Cu(In,Ga)H_2Se_2$ Thin Film Solar Cells with ZrN Back Reflector", *Appl. Phys. Letts.*, 85(13), Sep. 27, 2004, pp. 2634-2636.

Moons, E., et al., "Ohmic Contacts to $P-CuInSe_2$ Crystals", *J. of electron. Mats.*, 22(3), 1993, pp. 275-280.

Nelson, A., et al., "Formation of Schottky Barrier Height of Au Contacts to $CuInSe_2$", *J. Vac. Sci. Technol. A.*, 9(3), May/Jun. 1991, pp. 978-982.

\* cited by examiner

TECHNIQUE AND APPARATUS FOR DEPOSITING THIN LAYERS OF SEMICONDUCTORS FOR SOLAR CELL FABRICATION

CROSS-REFERENCE TO RELATED APPLICATION

This application claims the benefit of prior U.S. Provisional Application Ser. No. 60/552,736, filed Mar. 15, 2004 and incorporated herein by reference.

FIELD OF THE INVENTION

The present invention relates to method and apparatus for preparing thin films of semiconductors for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_y Se_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The first technique that yielded high-quality $Cu(In,Ga)Se_2$ films for solar cell fabrication was co-evaporation of Cu, In, Ga and Se onto a heated substrate in a vacuum chamber. However, low materials utilization, high cost of equipment, difficulties faced in large area deposition and relatively low throughput are some of the challenges faced in commercialization of the co-evaporation approach.

Another technique for growing $Cu(In,Ga)(S,Se)_2$ type compound thin films for solar cell applications is a two-stage process where metallic components of the $Cu(In,Ga)(S,Se)_2$ material are first deposited onto a substrate, and then reacted with S and/or Se in a high temperature annealing process. For example, for $CuInSe_2$ growth, thin layers of Cu and In are first deposited on a substrate and then this stacked precursor layer is reacted with Se at elevated temperature. If the reaction atmosphere also contains sulfur, then a $CuIn(S, Se)_2$ layer can be grown. Addition of Ga in the precursor layer, i.e. use of a Cu/n/Ga stacked film precursor, allows the growth of a $Cu(In,Ga)(S,Se)_2$ absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. U.S. Pat. No. 6,092,669 described sputtering-based equipment for producing such absorber layers. Such techniques may yield good quality absorber layers and efficient solar cells, however, they suffer from the high cost of capital equipment, and relatively slow rate of production.

One prior art method described in U.S. Pat. No. 4,581,108 utilizes a low cost electrodeposition approach for metallic precursor preparation. In this method a Cu layer is first electrodeposited on a substrate. This is then followed by electrodeposition of an In layer and heating of the deposited Cu/In stack in a reactive atmosphere containing Se. Although low-cost in nature, this technique was found to yield $CuInSe_2$ films with poor adhesion to the Mo contact layer. In a publication ("Low Cost Thin Film Chalcopyrite Solar Cells", Proceedings of $18^{th}$ IEEE Photovoltaic Specialists Conf., 1985, p. 1429) electrodeposition and selenization of Cu/In and Cu/In/Ga layers were demonstrated for CIS and CIGS growth. One problem area was identified as peeling of the compound films during solar cell processing. Later, in another reference ("Low Cost Methods for the Production of Semiconductor Films for CIS/CdS Solar Cells", Solar Cells, vol. 21, p. 65, 1987) researchers studied the cross-section of $Mo/CuInSe_2$ interface obtained by the above-mentioned method and found the $CuInSe_2$ to have poor adhesion to the Mo contact layer.

Irrespective of the specific approach used in a two-stage process, growing for example a $Cu(In,Ga)(S,Se)_2$ absorber film, individual thicknesses of the layers forming the metallic stacked structure need to be controlled so that the two molar ratios mentioned before, i.e. the Cu/(In+Ga) ratio and the Ga/(Ga+In) ratio, can be kept under control from run to run and on large area substrates. The molar ratios attained in the metallic stacked structures are generally preserved in macro scale during the reaction step, provided that the reaction temperature is kept below about 600° C. Therefore, the overall or average molar ratios in the compound film obtained after the reaction step is about the same as the average molar ratios in the metallic stacked structures before the reaction step. In prior art approaches all the Cu, In and/or Ga required for the final desired molar ratios are deposited on the substrate before the reaction step with S and/or Se. In other words, to grow a $Cu_{0.8}In_{0.8}Ga_{0.2}Se_x$, where x is close to 2, for example, the prior art techniques typically deposit a Cu/In/Ga stack, a In/Cu/Ga stack or a Cu—Ga/In stack, so that the Cu/(In+Ga) molar ratio of the stack is 0.8 and the Ga/(Ga+In) molar ratio of the stack is 0.2. This metallic stack is then selenized at high temperatures to form the compound. One problem associated with such approaches is that these precursors are relatively thick (500-1500 nm) and are typically rich in Group IIIB components of In and Ga, which have low melting points of about 156° C. and 30° C., respectively, and they cause micro-scale non-uniformities, as will be discussed next.

FIGS. 2a-2c demonstrate the problem of micro-scale non-uniformities which may be present in the metallic precursor layers, especially those with IB/IIIA molar ratios of less than or equal to 1. FIG. 2a schematically shows an exemplary Cu/In/Ga metallic stack with the exemplary overall molar ratios of Cu/(In+Ga)=0.8 and Ga/(Ga+In)=0.2 on a substrate. In this approach, a contact film 21 is first deposited onto a substrate 20, forming a base 22. A Cu layer 23 is then deposited over the contact film 21. The thickness of the Cu layer 23 may, for example, be about 200 nm. This Cu thickness and the desired molar ratios cited above require deposition of about 440 nm thick ID layer and about 80 nm thick Ga layer. These calculations can be made assuming densities of Cu, In and Ga to be 8.96 g/cc, 7.31 g/cc and 5.91 g/cc, respectively, and the atomic weights to be 63.54 g, 114.76 g and 69.72 g, respectively. Using a density value of 5.75 g/cc and a molar weight of 306.66 g for the selenized compound of $Cu_{0.8}In_{0.8}Ga_{0.2}Se_{1.9}$, it is also calculated that the metallic precursor of this example would yield approximately 1880 nm thick CIGS layer, assuming 100% density. The optimum thickness of CIGS layers for thin film solar cell applications is in the range of 500-5000 nm, preferably in the range of 700-2000 nm, smaller thicknesses being preferable because it reduces materials cost.

Referring back to FIG. 2a, deposition of about 200 nm thick Cu layer 23 is followed by the deposition of a nominally 440 nm thick In layer 24 and a nominally 80 nm thick Ga layer 25. The Cu layer 23 in the resulting metallic precursor stack 26 is shown as smooth and uniform, whereas, the In and Ga layer surfaces are depicted as non-planar. Although the surface morphologies of these layers depend strongly on the deposition techniques used, it is generally true that low-melting-temperature metals such as In and Ga tend to "ball" when deposited in thin film form, especially if they are deposited on top of each other. It should be noted that melting temperature of (Ga+In) mix is lower than the melting temperature of In which is around 156° C.

The metallic precursor layer 26 of FIG. 2a may have the desired Cu/(In+Ga) and Ga/(Ga+In) molar ratios in a global sense or in macro scale. However, in micro scale the situation is quite different as can be seen in FIG. 2b which shows a magnified view of the region 27 of FIG. 2a. Since the In layer thickness "t1" at and around point "A" is much larger than the In layer thickness "t2" at point B, the local Cu/(In+Ga) ratio is much smaller at and around point "A" than at and around point "B". Furthermore Ga/(Ga+In) ratio is also different at these two points, i.e. higher at point B compared to point A. It should be appreciated that after the reaction step with Se these micro-scale non-uniformities in the molar ratios of the metallic components are mostly transferred to the compound, yielding a CIGS layer that has in-plane compositional variations due to varying Cu/(In+Ga) and Ga/(Ga+In) ratios. This situation is schematically shown in FIG. 2c, which depicts a compound layer 29 obtained by reacting the precursor stack of FIG. 2b with Se. The region R1 in FIG. 2c corresponds approximately to the area around point A in FIG. 2b and the region R2 corresponds approximately to the area around point B in FIG. 2b. Accordingly, region R1 is an In-rich region and region R2 is a Cu-rich region. It should be noted that boundaries between these regions may not be as defined as suggested in FIG. 2c. Boundaries are shown as such just to demonstrate the point. In real films even the crystalline structures of these regions may be different. Cu-rich regions, after selenization, may contain large faceted grains of Cu-selenides, whereas, In or Ga-rich regions would be smoother with smaller grains.

When a solar cell is fabricated on the compound layer 29 of FIG. 2c, the copper rich region R2 containing highly conductive Cu-selenide phases would increase the leakage current across the device and reduce its voltage output, whereas the In-rich region R1 would increase its series resistance. Both effects would deteriorate the solar cell efficiency if they are extreme. Since the non-uniform surface morphologies such as the one depicted in FIGS. 2a-2c vary from run to run and from substrate to substrate, repeatability of the manufacturing process of this solar cell would also be poor and the yield for high efficiency large area device fabrication would be low. For best solar cell efficiencies and high manufacturing yields compound layers with macro-scale as well as micro-scale compositional uniformity are needed.

It should be noted that the example given above explained the micro-scale non-uniformity problem for the case of non-uniform or rough Group IIIA layer deposited on a smooth Group IB layer. However, similar problems are observed even if the morphologies of In and Ga layers were smooth in their as-deposited state. The reason is that even if the starting morphologies of In and Ga were smooth, during the reaction step with the Group VIA material, such as Se, the metallic precursor is heated up, typically to temperatures above 350° C. As the heating step is performed, In and Ga start to melt at temperatures above about 30° C. before reacting with the Group VIA material and they de-wet the substrate they are deposited on such as the Cu surface. This de-wetting phenomenon forms "balls" giving rise to rough morphologies similar to the one shown in FIG. 2b. Furthermore, balling becomes more extensive as the amount of the low-melting phase (in and/or Ga) in the stack is increased or the thickness of In and/or Ga layers are increased.

FIG. 3a shows an exemplary metallic precursor stack 36 deposited over a base 22, wherein the base 22 comprises a substrate 20 and a contact film 21 as in FIG. 2a, and the metallic precursor stack 36 comprises a substantially smooth Cu layer 33, a substantially smooth In layer 34 and a substantially smooth Ga layer 35, which may be deposited onto the base 22 by various thin film deposition techniques such as evaporation, sputtering or electrodeposition by taking certain measures such as keeping the base at below room temperature by forced cooling during deposition. In this example, the individual Cu, In and Ga layers within the stack 36 have flat surface morphologies. FIG. 3b shows the morphology of this precursor stack after it is heated up to a temperature of for example 160° C., which is higher than the In melting temperature as well as the melting temperature of the (Ga+In) composition lying over the Cu layer 33. Since the (Ga+In) composition of our example is 20% Ga and 80% In, the melting temperature is in the range of 100-120° C. according to the In—Ga binary phase diagram. The surface morphology of the (In+Ga) layer of FIG. 3b is very non-uniform and would give rise to the micro-scale compositional non-uniformities in the compound layers fabricated using such precursors as described before with reference to FIGS. 2a, 2b and 2c. It should be noted that although the interface between the Cu layer 33 and the (In+Ga) layer 36a of FIG. 3b is shown to be sharp, this interface in practice may be diffused depending upon the temperature of the heat treatment step.

One approach to address the micro-scale non-uniformity problem is described in U.S. Pat. No. 5,567,469 awarded to Wada et al. In this approach a portion of the low-melting phase or component, e.g. indium, is introduced into the precursor layer in the form of a compound selected from the group consisting of oxides, selenides and sulfides. These compounds of In have very high melting points. Therefore, when the precursor is heated up to perform the reaction step with Group VIA component(s), melting and balling of In is reduced since at least some of the In is in the form of a high melting point compound.

The discussion above concentrated on the problem of micro-scale compositional non-uniformities in metallic precursor layers used in prior art two-stage process approaches. An additional important problem, namely adhesion, was also identified for metallic precursor layers obtained by the low cost electrodeposition technique. Although electrodeposition is attractive to use in terms of its lower cost, there are other limiting factors in using the prior art electroplating approaches for the preparation of metallic Group IB and Group IIIA elemental stacks for the fabrication of Group IBIIIAVIA compound films as will be described below.

Cu, In and Ga have very different plating potentials. The molar standard electrode potentials of $Cu/Cu^{2+}$, $In/In^{3+}$ and $Ga/Ga^{3+}$ metal/ion couples in aqueous solutions are about +0.337 V, −0.342 V, and −0.52 V, respectively. This means that Cu can be plated out at low negative voltages. For In deposition, on the other hand, larger negative voltages are needed. For Ga deposition even larger negative voltages are required. Therefore, to form a stack containing Cu, In and Ga, Cu is typically electroplated first. This is then followed by deposition of In and then Ga. Otherwise, while electroplating one species, the other species on which deposition is carried out may partially dissolve into the electrolyte. For example, if a stack of Cu/Ga/In is electrodeposited, while depositing In over Ga, some Ga may be dissolving into the In deposition solution. This then would lead to poor control over Cu/(Ga+In) and Ga/(Ga+In) molar ratios in the precursor and the absorber layer after its formation. Similarly, deposition of a Cu layer over an In layer may result in loss of In from the In layer into the Cu plating electrolyte during processing. Therefore, prior-art methods have employed Cu/In/Ga stacks electroplated in that order. However, after selenization such stacks yielded compound layers with poor adhesion to the base or the substrate. Furthermore, compositional micro-scale non-uniformities such as those described with reference to FIGS. 3a and 3b did not allow formation of high quality Group IBIIIAVIA layers suitable for the fabrication of high efficiency solar cells. It should be appreciated that thin film deposition techniques with adhesion problems cannot be reliably scaled up for manufacturing of electronic devices, especially solar cells which are expected to have a lifetime of over 20 years.

As the brief review above demonstrates, there is still a need to develop low-cost deposition techniques to form high-quality, dense, well-adhering Group IBIIIAVIA compound thin films with macro-scale as well as micro-scale compositional uniformities.

SUMMARY OF THE INVENTION

The present invention advantageously provides for, in different embodiments, low-cost deposition techniques to form high-quality, dense, well-adhering Group IBIIIAVIA compound thin films with macro-scale as well as micro-scale compositional uniformities.

In one embodiment, there is provided a method of growing a Group IBIIIAVIA semiconductor layer on a base. The method includes depositing on the base a film of Group IB material and at least one layer of Group IIIA material, intermixing the film of Group IB material and the at least one layer of Group IIIA material to form an intermixed layer, and forming over the intermixed layer a metallic film comprising at least one of a Group IIIA material sub-layer and a Group IB material sub-layer.

In a preferred embodiment, the method further includes the step of reacting the intermixed layer and the metallic film with a Group VIA material to grow the desired semiconductor layer.

In various other embodiment, particular combinations of materials in different layers, as well as a plurality of layers forming a stack are described, with various intermixing and annealing combinations recited.

In another aspect of the invention, there is provided method of growing a Group IBIIIAVIA semiconductor layer on a base. In this aspect, on the base a metallic precursor is formed comprising a Group IB material, the metallic precursor containing a rough surface and microscale compositional non-uniformity, followed by the step of electrodepositing a Group IIIA material over the metallic precursor to form a stack and thereby substantially reduce the rough surface and obtain microscale compositional uniformity of the stack.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 5b shows a second metallic sub-layer deposited on the non-flat surface of the first metallic sub-layer, forming a flat surface topography;

DETAILED DESCRIPTION

Present invention overcomes the shortcomings of prior art techniques by addressing the important manufacturability and yield issues such as micro-scale compositional control and adhesion of the semiconductor absorber films to their substrates. It also enables low cost manufacturing of thin film solar cells.

Figure 3A:
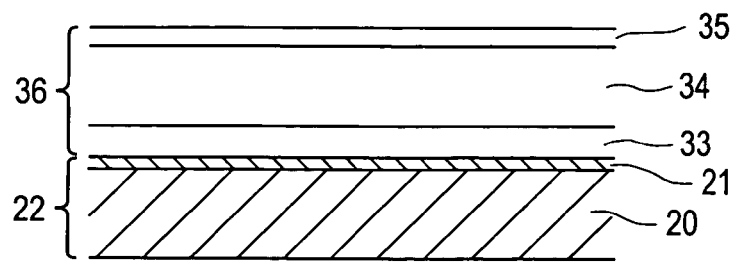
FIG. 3a shows a Cu/In/Ga metallic precursor stack deposited on a base exemplifying a uniform surface morphology in its as-deposited form.

In one embodiment, the metallic precursor preparation step is divided into at least two sub-steps to enhance more intimate mixing and reaction between the Group IB materials and Group IIIA materials, to reduce de-wetting of the substrate by the low melting point Group IIIA material phases and to reduce micro-scale compositional non-uniformity. As shown in FIGS. 6a-6d the first step of this metallic precursor preparation approach is the deposition or application of a first layer 60 and a first film 61 over a base 22. The terms layer and film are used interchangeably herein, though at times different terminology is used solely for convenience of differentiating words, and should be construed as such. Similarly, depositing of layers on a substrate is also referred to herein as growing of layers on the substrate or application of layers to the substrate. It should be noted that the base 22 may be similar to the base shown in FIG. 3a. Layers within the base 22 are not shown to simplify the drawing so that the invention could be described more clearly.

Figure 6A:
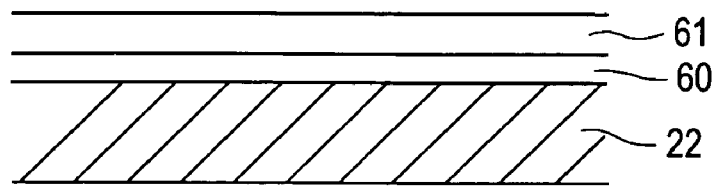
FIGS. 6a-6d show a preferred process sequence of the present invention.
Figure 6B:
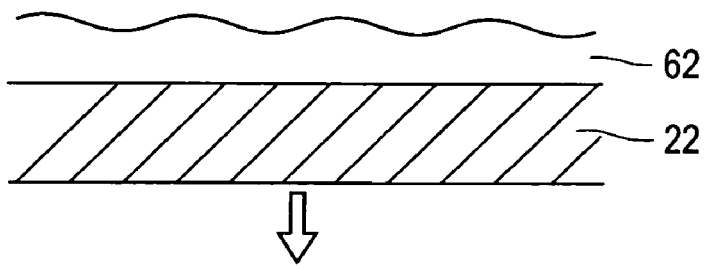

Referring back to FIG. 6a, the first layer 60 comprises at least one Group IB material and the first film 61 comprises at least one Group IIIA material. Although what is shown in FIG. 6a is the preferred deposition order of the first layer and the first film, it is possible to change this order, i.e. to deposit the first film 61 first on the base 22 and to deposit the first layer 60 over the first film 61. The preferred thickness for the first layer 60 is in the 10-150 nm range, more preferably in the 50-100 nm range. The preferred thickness for the first film 61 is in the 20-250 nm range, more preferably in the 100-200 nm range. The structure shown in FIG. 6a is treated at a first treatment step to promote intermixing between the first layer 60 and the first film 61. The first treatment step may comprise heating, microwave treating, laser treating etc. of the structure. Treatment may be carried out in air, in vacuum, in a reducing atmosphere comprising for example hydrogen or carbon monoxide or in a substantially inert atmosphere at a temperature within the range of 50-350° C., preferably within the range of 80-200° C., for a time period varying from one second for the case of laser treating to 30 minutes for the case of furnace annealing. Preferably treatment is carried out for a period of 5-600 seconds, more preferably for a period of 5-300 seconds. The first treatment step results in a first intermixed layer 62 on the base 22 as shown in FIG. 6b. The intermixed layer 62 comprises Group IBIIIA solid solutions and/or alloys and has a much smoother surface morphology compared to the layer depicted in FIG. 3b because the first film 61 comprising low temperature melting Group IIIA materials is thin. With thinner Group IIIA material layer, the surface tension is lower and therefore the balling phenomenon is less severe.

Figure 6C:
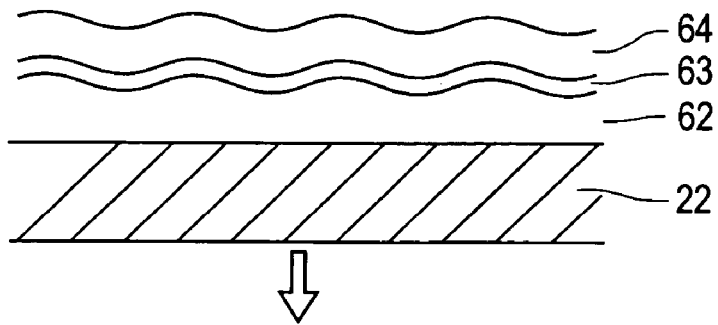
Figure 6D:
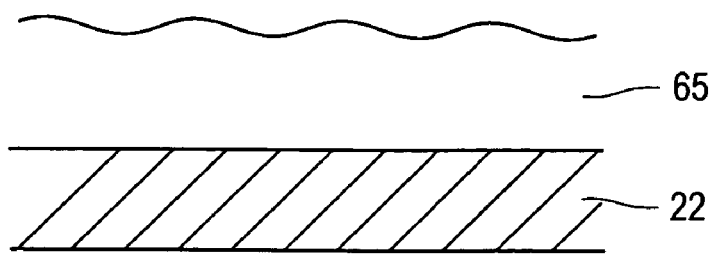

The next step in the process is deposition of a second layer 63 and a second film 64 on the first intermixed layer 62 as shown in FIG. 6c. The second layer 63 comprises at least one Group IB material and the second film 64 comprises at least one Group IIIA material. Although what is shown in FIG. 6c is the preferred deposition or application order of the second layer and the second film, it is possible to change this order, i.e. to deposit the second film 64 on the first intermixed layer 62 and to deposit the second layer 64 over the second film 64. The preferred thickness for the second layer 63 is in the 10-150 nm range, more preferably in the 50-100 nm range. The preferred thickness for the second film 64 is in the 20-250 nm range, more preferably in the 100-200 nm range. The structure shown in FIG. 6c is treated at a second treatment step to promote intermixing between the first intermixed layer 62, the second layer 63 and the second film 64. The second treatment step may comprise heating, microwave treating, laser treating etc. of the structure. Treatment may be carried out in air, in vacuum, in a reducing atmosphere or in a substantially inert atmosphere at a temperature within the range of 50-350° C., preferably within the range of 80-200° C., for a time period varying from one second for the case of laser treating to 30 minutes for the case of furnace annealing. Preferably treatment is carried out for a period of 5-600 seconds, more preferably for 3-300 seconds. The second treatment step results in a second intermixed layer 65 on the base 22 as shown in FIG. 6d. The second intermixed layer 65 comprises Group IBIIIA solid solutions and/or alloys and has substantially flat surface morphology and uniform micro-scale composition.

It should be noted that the deposition and treatment steps described above may be repeated several times, preferably 2-5 times, to obtain a metallic precursor of desired thickness and composition with micro-scale compositional uniformity. If more steps are used, the individual thicknesses of the deposited or applied layers may be reduced, improving the surface morphology. After the desired thickness of the Group IBIIIA metallic precursor is obtained, such as shown in FIG. 6d, this precursor may be reacted with at least one Group VIA material to form a Group IBIIIAVIA compound layer with high density and good micro-scale compositional uniformity. Referring back to FIG. 6c, optionally, once the structure in this figure is obtained the structure may be reacted with a Group VIA material without carrying out the second treatment step. This way a Group IBIIIAVIA compound layer with good micro-scale compositional uniformity may also be formed. Referring back to FIGS. 6a-6d, this preferred embodiment of the present invention improves the surface morphology and micro scale compositional uniformity of the metallic precursor by dividing the precursor deposition process into multiple steps and introducing intermixing or annealing steps. This way, non-uniformities in individual intermixed layers are minimized since they are thin. Even if there were non-uniformities in the first intermixed layer formed on the base, the next intermixed layer formed on the first one would reduce these non-uniformities.

The invention will now be described using the example of forming or growing a $Cu_{0.8}In_{0.8}Ga_{0.2}Se_{1.9}$ layer.

EXAMPLE 1

A Mo coated glass sheet may be used as the base. A 100 nm thick Cu layer may be deposited over the Mo layer. This is then followed by the deposition of a 220 nm thick In film and a 40 nm thick Ga layer. The stack is annealed at a temperature of 80-200° C. for 5-600 seconds to enhance alloying between Cu, In and Ga. Over the alloyed layer, 100 nm of Cu, 220 nm of In and 40 nm of Ga are then deposited or applied. The precursor is selenized by well known approaches such as in hydrogen selenide gas or selenium vapor to form the $Cu_{0.8}In_{0.8}Ga_{0.2}Se_{1.9}$ compound. It should be noted that selenization may be carried out by various other means such as depositing Se over the metallic precursor and heating up the stacked layer, heating the substrate in a Se-containing gaseous or liquid atmosphere etc. for times ranging from 5 minutes to 60 minutes.

EXAMPLE 2

A Mo coated glass sheet may be used as the base. A 100 nm thick Cu layer may be deposited over the Mo layer. This is then followed by the deposition of a 220 nm thick In film and a 40 nm thick Ga layer. The stack is annealed at a temperature of 80-200° C. for 5-600 seconds to enhance alloying between Cu, In and Ga. Over the alloyed layer, a 100 nm of Cu, a 220 nm of In and 40 nm of Ga are then deposited. A second anneal step is applied at 80-200° C. for 5-600 seconds to promote further alloying between the layers of the metallic precursor. The precursor thus obtained is then selenized by well known approaches such as in hydrogen selenide or selenium vapor to form the $Cu_{0.8}In_{0.8}Ga_{0.2}Se_{1.9}$ compound. It should be noted that selenization may be carried out by various other means such as depositing Se over the metallic precursor and heating up the stacked layer, heating the substrate in a Se-containing gaseous or liquid atmosphere etc. for times ranging from 5 minutes to 60 minutes.

EXAMPLE 3

The approaches in Example 1 or Example 2 are used except that Cu, In and Ga layers may be deposited in four steps instead of two steps. Accordingly, thickness of Cu, In and Ga for each deposition step may be reduced to 50 nm, 110 nm and 20 nm, respectively. By heat treating the layers after each deposition step for reduced times of preferably 2-300 seconds (except for the last one for the case of Example 1), a smooth and compositionally uniform metallic precursor may be obtained. Selenization of this precursor yields compositionally uniform, high quality $Cu_{0.8}In_{0.8}Ga_{0.2}Se_{1.9}$ compound layer.

In another embodiment of the present invention the morphology of the deposited films are further improved and the micro-scale compositional uniformity is further enhanced by dividing the metallic precursor preparation step into at least two sub-steps and selecting the composition of the sub-layers deposited by the sub-steps such that the sub-layers deposited early on the base do not contain substantial amount of segregated Group IIIA materials after the treatment steps promoting mixing and alloying between the metallic components. This approach will now be explained by using the phase diagrams shown in FIGS. 4 and 5.

Figure 4:
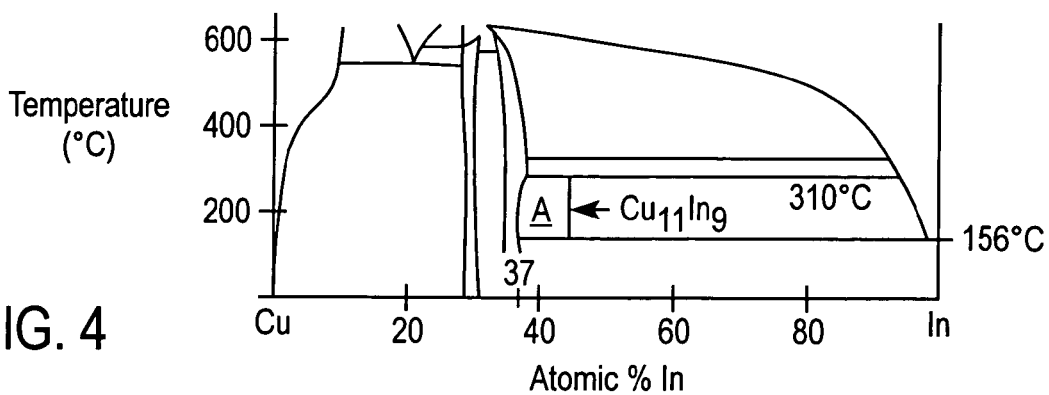
FIG. 4 shows a Cu—In binary phase diagram.

FIG. 4 shows the binary phase diagram for Cu—In (reference: P. R. Subramanian and D. E. Laughlin, Bulletin of Alloy Phase Diagrams, vol. 10, No. 5, p. 554, 1989), including the position of the stable alloy phase of $Cu_{11}In_9$. It can be seen from this diagram that if a film with Cu/In ratio of less than 11/9 (1.22) is heated above about 156° C., a liquid phase of In-rich solution would segregate from a Cu-rich phase of $Cu_{11}In_9$ and/or other Cu-rich Cu—In alloy phases with around 30-37% In. If the Cu/In ratio is more than and equal to 1.22 but less than about 1.7 (region A in FIG. 4) and the temperature is in the 156-310° C. range, only solid phases of $Cu_{11}In_9$ and those corresponding to about 37% In would be present in the film under equilibrium conditions. If the Cu/In ratio is more than about 1.7, then only Cu-rich solid phases would be present under equilibrium conditions up to a temperature of about 550° C.

Similarly, it can be seen from the Cu—Ga binary phase diagram (reference: M. Hansen, Constitution of Binary Alloys, McGraw Hill, 1958, p. 583) of FIG. 5 that compositions with a Ga/Cu ratio of larger than 2 would yield a Ga-rich liquid phase if heated to above 30° C. In region B of the phase diagram (about 40-67% Ga, and temperatures up 254° C.) there would be only solid phases. For a Ga content of about less than 40%, only solid phases would be present even at high temperatures of above 550° C.

Present embodiment of the invention minimizes liquid phase segregation during the mixing/alloying step of the process by carefully selecting the Group IB/IIIA molar ratios i.e. Cu/In, Cu/Ga or Cu/(In+Ga) molar ratios, of the sub-layers deposited on the base. This way, de-wetting and balling by the low-melting phases is minimized along with micro-scale compositional non-uniformities resulting from them as will be described in the example given below.

EXAMPLE 4

A $CuInSe_2$ layer may be formed on a Mo coated glass base by carrying out the following steps; a) deposit a 200 nm of Cu on the base, b) deposit a 360 µm of In over the Cu so that the Cu/In molar ratio is 1.22, c) treat the stack at a temperature range of 156-310° C., preferably for a time period of 5-600 seconds, to form an alloyed layer comprising substantially the $Cu_{11}In_9$ solid phase, d) deposit 80 nm of In over the alloyed layer, and e) selenize thus obtained metallic precursor as described before. It should be noted that after the last In deposition a low temperature anneal step, such as at 100-200° C. for about 2-300 seconds, may also be carried out before the selenization step to enhance intermixing between the alloyed layer and the last In layer.

EXAMPLE 5

The process of Example 4 may be varied in a way that even more Cu (alternately less In) may be deposited in steps a) and b) so that the Cu/In ratio is more than 1.22 but is within the region A of FIG. 4. In this case after step c) the alloyed layer comprises $Cu_{11}In_9$ solid phase as well as other solid phases shown in FIG. 4, with In content of 37% or less, to the left of region A. In this case more In needs to be deposited in step d) to compensate for the higher Cu/In ratio of the alloyed layer. Rest of the steps would be similar to those described in Example 4. It should be noted that the Cu/In ratio in the alloyed layer may be made even higher by selecting the thicknesses of the Cu and In layers corresponding to less than about 37% In (to the left of region A). In this case a much higher temperature range (up to about 600° C.) may be used during the treating step c) without forming a liquid phase to cause de-wetting and balling.

EXAMPLE 6

A $CuInSe_2$ layer may be formed on a Mo coated glass base by carrying out the following steps; a) deposit 100 nm of Cu on the base, b) deposit 180 nm of In so that Cu/In molar ratio is 1.22, c) treat the stack at a temperature range of 156-310° C., preferably for a period of 2-300 seconds, to form an alloyed layer comprising substantially the $Cu_{11}In_9$ solid phase, d) repeat steps a), b) and c), and then e) deposit 80 nm of In and, f) selenize thus obtained metallic precursor as described before. It should be noted that after the last In deposition step a low temperature anneal step, such as at 100-200° C. for about 2-300 seconds, may also be carried out before the selenization step to enhance intermixing between the alloyed layer and the last In layer.

EXAMPLE 7

A $CuInSe_2$ layer may be formed on a Mo coated glass base by carrying out the steps of Example 6 except that the thicknesses of the Cu and In films are adjusted in steps a), b) and d) to yield Cu/In molar ratios of more than 1.22 and the thickness of the In layer in step e) is adjusted to yield an overall Cu/In ratio of I. In this case higher temperatures of up to about 600° C. may be used in the treatment step c) for even shorter time periods of 2-10 seconds, especially if the overall In content in alloyed layers is less than about 37%.

EXAMPLE 8

Figure 5:
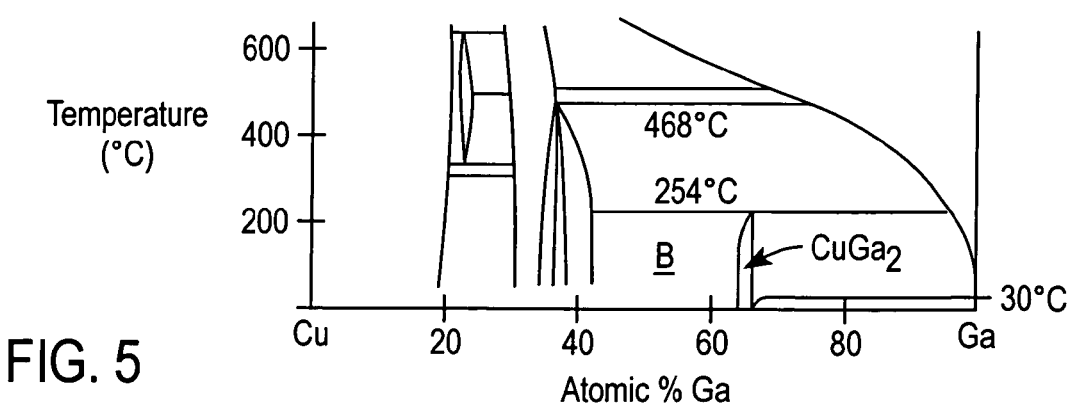
FIG. 5 shows a Cu—Ga binary phase diagram.

A $CuGaSe_2$ layer may be formed on a Mo coated glass base by carrying out the following steps; a) deposit 200 nm of Cu on the base, b) deposit 264 nm of Ga so that Cu/Ga molar ratio is about 1.5, c) treat the stack at a temperature range of 30-600° C., preferably for a period of 5-600 seconds, to form an alloyed layer comprising substantially the Cu-rich solid phases with compositions to the left of region B in FIG. 5, d) deposit about 66 nm of Ga over the alloyed layer to make the overall Cu/Ga ratio about 1, and e) selenize thus obtained metallic precursor as described before. It should be noted that after the last Ga deposition step a low temperature (preferably <254° C.) anneal may also be carried out for a brief period such as for 2-300 seconds before the selenization step to enhance intermixing between the alloyed layer and the last Ga layer.

Examples 4-8 above described the present embodiment in terms of $CuInSe_2$ and $CuGaSe_2$ film growth. Those skilled in the art would recognize that same approaches may be utilized for the growth of $Cu(In,Ga)Se_2$ or $Cu(In,Ga)(SSe)_2$ layers of varying compositions and in general for the growth of many different Group IBIIIAVIA compound layers. One specific embodiment which will be described in the example below comprises depositing a Cu and In containing layer which yields an alloy composition without low melting phases after a first treatment step, and a Cu and Ga containing layer which yields an alloy composition without low melting phases after a second treatment step. When formed on top of each other these two layers form an overall metallic precursor film with desired composition in macro as well as micro scale.

EXAMPLE 9

A $Cu(In_{0.69}Ga_{0.31})Se_k$ layer with k close to 2 may be formed on a Mo coated substrate by carrying out the following steps; a) deposit a Cu layer on the Mo surface, b) deposit an In layer on the Cu layer so that the Cu/In molar ratio is about 1.22, c) treat the stack at an elevated temperature, preferably at a temperature in the range of 156-310° C. for a period of 5-600 seconds to form a first alloyed layer comprising substantially the $Cu_{11}In_9$ solid phase, d) deposit a Cu layer on the alloyed layer, e) deposit a Ga layer over the Cu layer such that the Cu/Ga ratio is about 0.5, f) treat the stack at an elevated temperature preferably at a temperature in the range of 30-254° C. for a period of 5-600 seconds to form a second alloyed layer comprising substantially the $CuGa_2$ solid phase, g) selenize thus obtained metallic precursor. It should be noted that the thicknesses of Cu, In and Ga deposited in steps a), b), d) and e) may be adjusted to adjust the overall stoichiometry or composition. If the Cu thickness of step a), In thickness of step b), Cu thickness of step d) and Ga thickness of step e) are selected to yield one mole of $Cu_{11}In_9$ and two moles of $CuGa_2$, the overall composition of the metallic precursor would be $Cu_{11}In_9Cu_2Ga_4$, which is equivalent to $Cu_{13}In_9Ga_4$ or $CuIn_{0.69}Ga_{0.31}$. When selenized, this provides a compound layer with Cu/(In+Ga) ratio of 1 and Ga/(Ga+In) ratio of 0.31. This is a desirable composition for high efficiency solar cell fabrication. The treatment step, f), may be skipped in the process sequence. The deposition sequence may also be altered. For example, steps d), e) and f) may be carried out first. This may than be followed by steps a), b) and optionally c). The overall precursor may then be selenized as in step g). Deposition sequences may further be altered by depositing In first Cu later and/or Ga first Cu later etc. The approach described in this example is unique in terms of utilizing two alloy compositions, one Cu—In alloy ($Cu_{11}In_9$) and one Cu—Ga alloy ($CuGa_2$) which are stable solid phases that do not melt at temperatures of up to about 254° C. therefore yielding morphologically and compositionally uniform metallic precursors which can be reacted with Group VIA materials to form uniform Group IBIIIAVIA compound layers. In that respect a $CuGa_2/Cu_{11}In_9$ stack or a $Cu_{11}In_9/CuGa_2$ stack with exemplary molar ratios mentioned above may be formed by any technique such as sputtering, evaporation, electroplating etc., and then exposed to Se and/or S to form a good quality compound layer. It should be noted that the interface between the $Cu_{11}In_9$ and $CuGa_2$ layers of the stack is not expected to be very sharp, i.e. some degree of reaction and intermixing is expected at this interface between the two alloy phases during processing.

The Group IB and Group IIIA materials of the present invention may be deposited by various thin film deposition techniques such as sputtering, evaporation or wet electroless deposition. One preferred method for practicing the teachings of the present invention is the low cost electrodeposition technique, which when used in accordance with the teachings of the present invention provides technical benefits beyond the already described economic benefits.

For the case of $Cu(In,Ga)Se_2$ film growth Cu, In and Ga layers are electrodeposited at controlled thicknesses and alloying or intermixing steps of the process are used employing furnace annealing, laser, microwave or RTP (rapid thermal processing). Examples will be given below to demonstrate the use of electrodeposition for growing a $Cu(In,Ga)Se_2$ film with the exemplary composition of $Cu_{0.8}In_{0.8}Ga_{0.2}Se_{1.9}$).

EXAMPLE 10

A Mo coated substrate may be used as the base. An approximately 100 nm thick Cu layer may be electrodeposited over the Mo layer. This is then followed by the electrodeposition of an about 220 nm thick In film and a nominally 40 nm thick Ga layer. The stack is annealed at a temperature of 80-200° C. preferably for 5-600 seconds to enhance alloying between Cu, In and Ga. Over the alloyed layer, 100 nm of Cu, 220 nm of In and 40 nm of Ga is then electrodeposited. The precursor is selenized by well known approaches such as in hydrogen selenide gas or selenium vapor for a time period of 5 minutes to 60 minutes to form the $Cu_{0.8}In_{0.8}Ga_{0.2}Se_{1.9}$ compound. It should be noted that selenization may be carried out by various other means such as depositing Se over the metallic precursor and heating up the stacked layer, heating the substrate in a Se-containing gaseous or liquid atmosphere etc.

EXAMPLE 11

A Mo coated substrate may be used as the substrate. An approximately 100 nm thick Cu layer may be electrodeposited over the Mo layer. This is then followed by the electrodeposition of an about 220 nm thick In film and a nominally 40 nm thick Ga layer. The stack is annealed at a temperature of 80-200° C. preferably for 2-300 seconds to enhance alloying between Cu, In and Ga. Over the alloyed layer, a nominally 100 nm of Cu, a nominally 220 nm of In and about 40 nm of Ga are then electrodeposited. A second anneal step is applied at 80-200° C. preferably for 2-300 seconds to promote further alloying between the layers of the metallic precursor. The precursor thus obtained is then selenized by well known approaches such as in hydrogen selenide or selenium vapor for a time period of 5 minutes to 60 minutes to form the $Cu_{0.8}In_{0.8}Ga_{0.2}Se_{1.9}$ compound. It should be noted that selenization may be carried out by various other means such as depositing Se over the metallic precursor and heating up the stacked layer, heating the substrate in a Se-containing gaseous or liquid atmosphere etc.

The present invention has unique capabilities to allow efficient use of the low cost electrodeposition technique for the deposition of metallic components Cu, In and Ga. In general Cu. In and Ga have very different plating potentials. Therefore, to form a metallic precursor stack containing Cu, In and Ga, the Cu layer is typically electroplated first. This is then followed by deposition of all of the necessary In and then all of the necessary Ga. Otherwise, while electroplating one species, the other species on which deposition is carried out may partially dissolve into the electrolyte making compositional control very poor.

In an embodiment of the present invention Cu and at least one Group IIIA component are electrodeposited first on a base. A treatment step is then used to promote alloying and formation of at least one Group IBIIIA alloy and/or solid solution. Plating potentials of Group IIIA materials within a Group IBIIIA alloy and/or solid solution are shifted and the amount of Group IIIA material at the surface of the Group IBIIIA alloy and/or solid solution film is also reduced. Both of these factors allow electrodeposition of the next stack efficiently without loosing substantial Group IIIA material into the plating solution of the next step. For example, a precursor layer may be formed on a base as follows. A Cu layer is first electrodeposited on the base. This is followed by the electrodeposition of a Ga layer. The treatment step such as heat treatment forms an alloyed Cu—Ga layer. Over the Cu—Ga layer an In layer is electrodeposited. By diffusing Ga into the Cu layer and chemically tying Ga to Cu in a Cu—Ga alloy composition or solid solution, the electrode potential of Ga in the alloy is shifted compared to the electrode potential of pure Ga, and therefore electrodeposition of In over Cu—Ga alloy is achieved without much loss of Ga into the In plating solution. Furthermore, the Ga content on the surface of the Cu—Ga alloy or solid solution layer is much less than the Ga content on the surface of the Cu/Ga stack initially electroplated on the base. Therefore, Ga content available at this surface for possible removal during the In deposition step is drastically reduced by the use of the alloying step of the present invention. Another benefit of the process of the present invention is the fact that during alloying Ga diffuses into Cu and/or Cu diffuses into Ga. The result is that Ga is brought close to the interface of the metallic precursor film and the base without compromising compositional control. Bringing Ga close to the base improves the adhesion of the Group IBIIIAVIA compound layer to the base after the selenization and/or sulfidation reaction steps. This argument may be made for all alloyed layers obtained through the steps of the present invention including all Cu—In alloys and Cu—Ga alloys.

Improved adhesion to the base may also be obtained by directly plating a Cu—Ga mixed or alloy layer onto the base.

Figure 7:
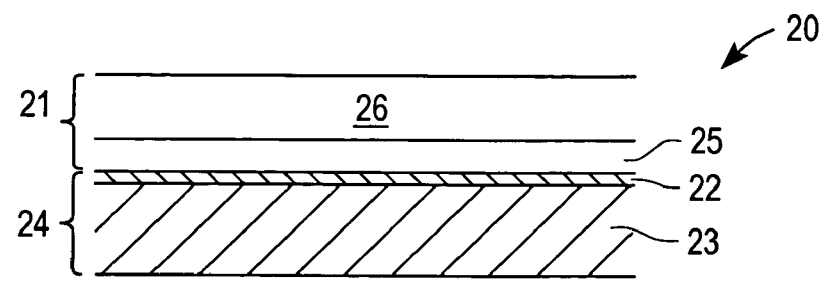
FIG. 7 shows a preferred precursor stack comprising Cu—Ga alloy and In layers.

In a preferred embodiment of the present invention the Cu—Ga alloy layer 25 is electrodeposited from a suitable electrolyte onto the conductor 22 as shown in FIG. 7. The substrate 23 may be a rigid or flexible conductor or insulator material such as a metal or glass sheet or a metallic or insulating foil. Metallic foils include Ti, stainless steel or Mo foils. Insulating foils include those made from high-temperature materials and polymers such as polyimides and mica. The conductor 22 comprises materials that make good ohmic contact to the absorber layer after it is fully formed. Such ohmic contact materials include Ti, Mo, W, Ta and their nitrides. The Cu—Ga alloy layer 25 may contain 5-50 atomic % Ga, preferably 10-30 atomic % Ga. The thickness of the Cu—Ga alloy layer 25 may be in the 100-500 μm range. Electrodeposition may be carried out using glycerine based electrolytes containing Ga and Cu ions. Gallium and Cu ion sources may be metal salts such as copper and gallium chlorides, which are dissolved into the glycerine solution with the help of weak acids such as citric acid or tartaric acid. Electrodeposition may be carried out at room temperature or in chilled electrolytes kept at 5-15° C. Plating current densities may be in the range of 0.5-40 mA/cm$^2$, preferably in the range of 1-20 mA/cm$^2$. Gallium-to-Cu ratio in the electrolyte may be changed in the range of 0.5-5 to control the Ga/Cu ratio in the deposited film. Deposited layers may contain at least one of the alloy species such as $Cu_9Ga_4$, $Cu_3Ga_2$ and $CuGa_2$. In one preferred embodiment the Cu—Ga layer comprises a solid solution that can be represented by the chemical formula of $Cu_{(1-x)}Ga_x$ where x is less than or equal to about 0.20. Gallium is tightly bound to Cu in this solid solution composition, which improves stability and repeatability of the process disclosed in this invention. It is important that the Cu—Ga alloy layer does not contain a substantial amount of free Ga phase. To avoid such a situation, after deposition of a Cu—Ga layer on the base 24 (FIG. 7), the structure may be annealed for a suitable period of time to assure complete alloying of Cu and Ga. For example, after electrodeposition of the Cu—Ga layer on the base, the "base/Cu—Ga layer" structure may be annealed at a temperature range of 50-500° C., preferably at a temperature range of 100-200° C. for a period of 1 second to 15 minutes, preferably 5 seconds to 1 minute. Annealing may be carried out in air, vacuum, inert gas or reducing atmosphere, using a furnace, oven or rapid thermal annealing system. Laser annealing, or microwave annealing may also be employed. In laser annealing the Cu—Ga layer is exposed to a large area beam of a laser such as a $CO_2$ laser, YAG laser or Ar laser for a short period of time, such as a few seconds, to promote alloying.

After annealing, the Cu—Ga alloy layer 25 is fully formed and an In layer 26 is electroplated over the Cu—Ga alloy layer 25. Indium plating may be carried out using well-established electrolytes such as the In-sulfamate electrolyte, which is commercially available from Indium Corporation of America. The plating current density may be in the range of 10-100 mA/cm$^2$, preferably in the range of 20-50 mA/cm$^2$ for this process. The thickness of the In layer may be in the 200-1000 nm range depending upon the thickness of the Cu—Ga alloy layer and the desired Cu/(In+Ga) and Ga/(Ga+In) molar ratios. Once the structure of FIG. 7 is obtained it may be reacted with Group VIA materials to form the compound layer as described before.

Figure 1:
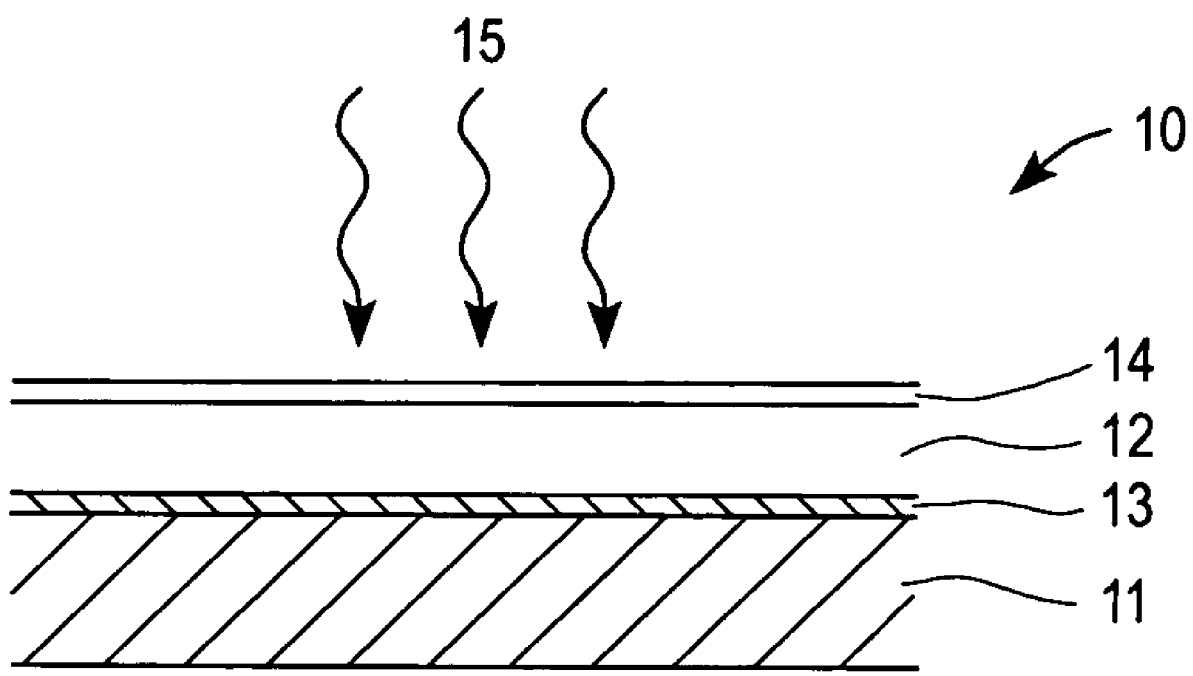
FIG. 1 is a cross-sectional view of a solar cell employing a Group IBIIIAVIA absorber layer.
Figure 2A:
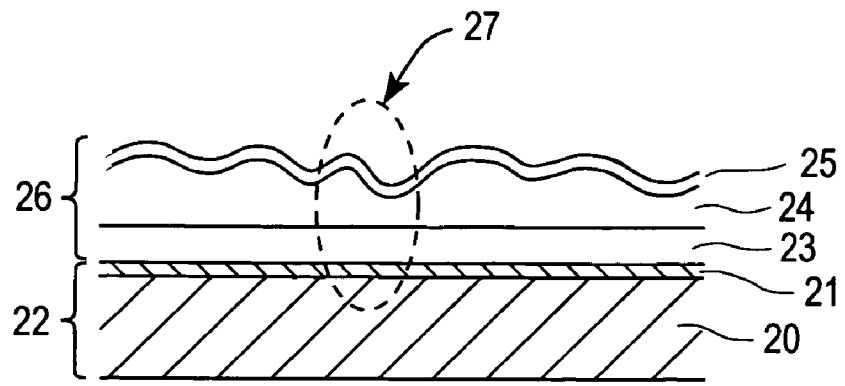
FIG. 2a shows a prior art Cu/In/Ga metallic precursor stack deposited on a base exemplifying the non-uniform surface morphology of In and Ga layers due to "balling;"
Figure 2B:
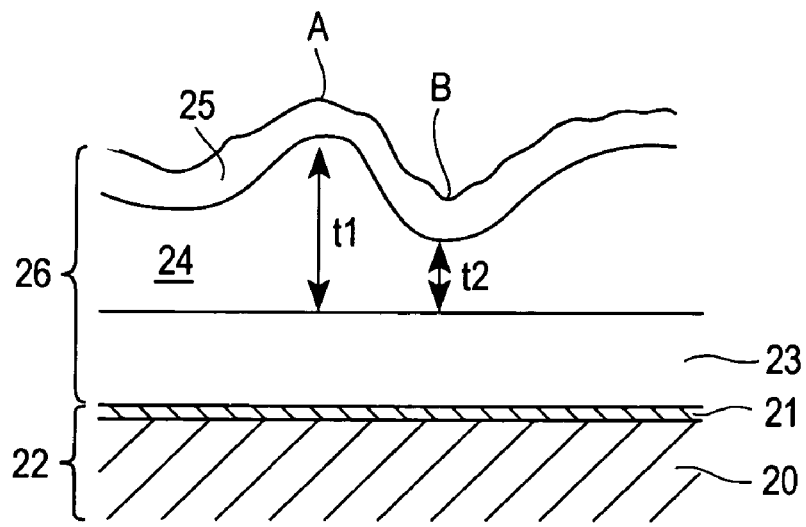
FIG. 2b shows a larger view of section 27 in FIG. 2A.
Figure 2C:
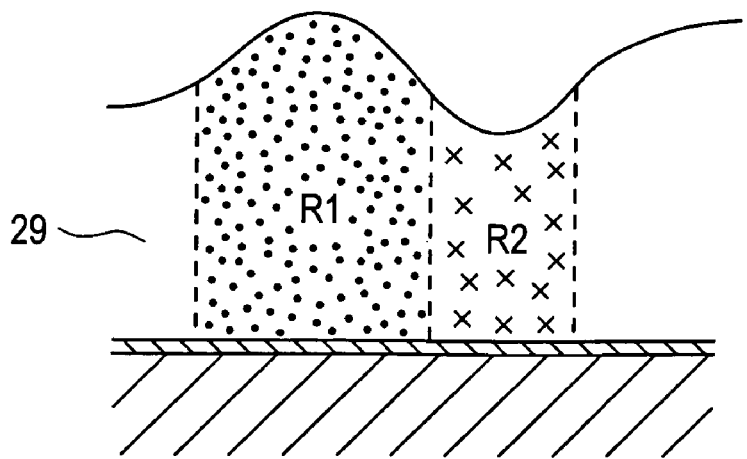
FIG. 2c shows a prior art Group IBIIIAVIA compound film with micro-scale compositional non-uniformity that is obtained by reacting the metallic precursor layer shown in FIG. 2b with a Group VIA material.
Figure 3B:
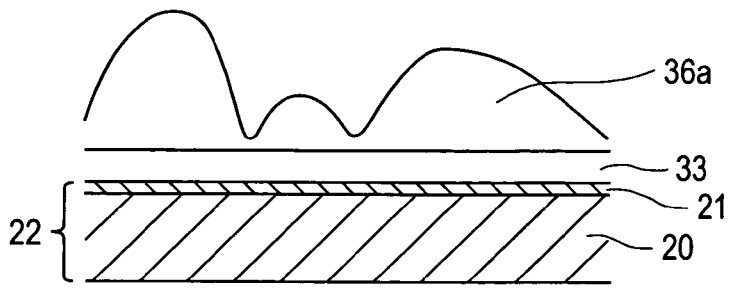
FIG. 3b shows the metallic precursor of FIG. 3a after it is heated to elevated temperatures exemplifying formation of a non-uniform surface morphology due to melting of Group IIIA phases.
Figure 8A:
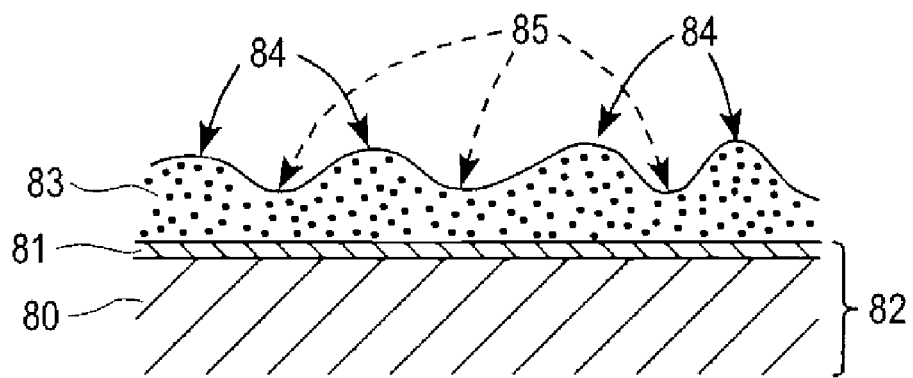
FIG. 8a shows a first metallic precursor sub-layer with non-flat surface topography.
Figure 8B:
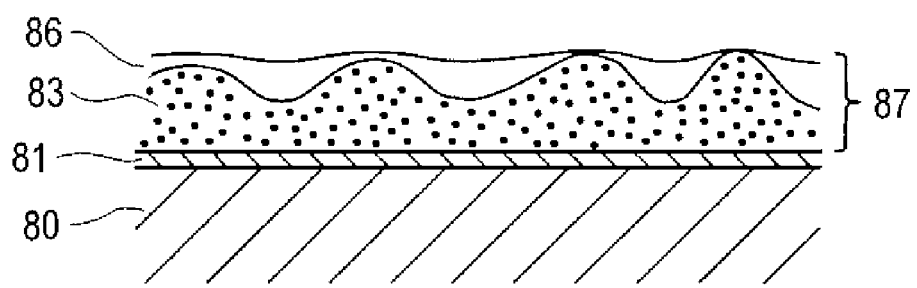

Referring back to the issue of micro-scale non-uniformities, forming a first metallic precursor sub-layer comprising at least one Group IB material and then depositing a second metallic Group IIIA-rich precursor sub-layer over the first sub-layer in a manner that provides a substantially flat surface topography for the overall metallic precursor has certain benefits. FIG. 8a shows an exemplary first metallic precursor sub-layer 83 formed on the base 82 comprising a substrate 80 and a contact film 81. The first metallic precursor sub-layer has a surface topography with thick regions 84 and thin regions 85. As described before in reference to FIG. 2b, such non-uniform surface may result from the de-wetting or balling phenomena when, especially Group IIIA-rich films are deposited over films comprising at least one Group IB material, or as seen in FIG. 3b, such surfaces may form upon heat treatment of metallic precursors comprising Group 1B and Group IIIA materials. The sub-layer 83 may result from annealing of the Cu—Ga layer of FIG. 7 as described earlier. The average thickness of the sub-layer may be in the range of 200-2000 nm and the local variation in the thickness may be as large as +/−70% of the average thickness. For example, an exemplary sub-layer with an average thickness of 600 nm may have thin areas as thin as 180 nm and thick regions as thick as 1020 nm. What ever is the origin, such non-uniformities are detrimental to micro-scale compositional uniformity of the precursor films and the compound layers obtained using them. Furthermore, as discussed before the thick regions 84 are usually richer in low melting Group IIIA materials compared to the thin regions 85. To overcome this problem FIG. 8b demonstrates a process step that deposits a second metallic Group IIIA-rich precursor sub-layer 86 over the first sub-layer 83 in a manner that levels the surface topography. This way a thicker Group IIIA-rich layer is deposited over the thin region 85 of the first sub-layer 83, and a thinner Group IIIA-rich layer is deposited over the thick region 84 of the first sub-layer 83. If the thin and thick regions were poor and rich in Group IIIA material, respectively, it can be seen that the relatively flat Group IIIA-rich layer 86 compensates for the micro-scale compositional non-uniformities and yields a more compositionally and structurally uniform precursor stack 87 that can be reacted with Group VIA materials to form a high quality Group IBIIIAVIA compound layer.

Electrodeposition and electroless deposition techniques are wet processing approaches that have unique qualities to practice the invention disclosed above. Solutions or electrolytes used for the above techniques may be formulated to obtain "leveled" deposits on rough surfaces. Various organic and inorganic additives may be utilized in such electrolytes to enhance deposition in the valleys or low surfaces on the substrate while suppressing deposition on the peaks or high points. Therefore, if a Group IIIA-rich sub-layer was electroplated on the first metallic sub-layer 83 of FIG. 8a, for example, plating would be enhanced over thin regions 85 and suppressed over thick regions 84, yielding a metallic Group IIIA-rich sub-layer 86 with surface profile very similar to that shown in FIG. 8b. Many different types of additives may be used in the electrolytes or solutions to achieve the above described leveling effect. These include accelerators, inhibitors, levelers, surfactants etc. that comprise chemicals such as thiourea, polyethylene glycol, polyether sulfides, mercapto compounds, coumarin, aromatic sulfonamides, saccarin, bis-sodium sulfopropyl disulfides, high molecular weight polymers with amine or amide functional groups etc. Valleys with widths as small as 10-100 nm or even smaller may be preferentially filled and leveled with an electroplated material, such as a Group IIIA-rich sub-layer, using such additives in the electroplating solution.

It should be noted that electroplating or electroless plating of a Group IIIA-rich surface film over a previously prepared substantially metallic precursor layer has the benefits of, i) covering up and adjusting the composition of any regions that may contain excess Group IB materials, which after formation of the Group IBIIIAVIA layer and solar cell devices would cause shunting and device performance reduction, ii) flattening the surface morphology of the overall precursor layer and the compound film after reaction with Group VIA materials so that better quality junctions may be formed by the deposited CdS layer or other junction forming material, iii) densification of the surface layer of the overall precursor layer so that after compound formation better junctions may be fabricated using such compound layers. These benefits are applicable to fixing problems with precursor layers that are deposited by other techniques also. In this case the electrodeposition step which applies a Group IIIA-rich layer on a previously formed precursor layer may be considered to be a surface treatment step that improves surface morphology, increases density and improves the micro-scale compositional uniformity.

Figure 9:
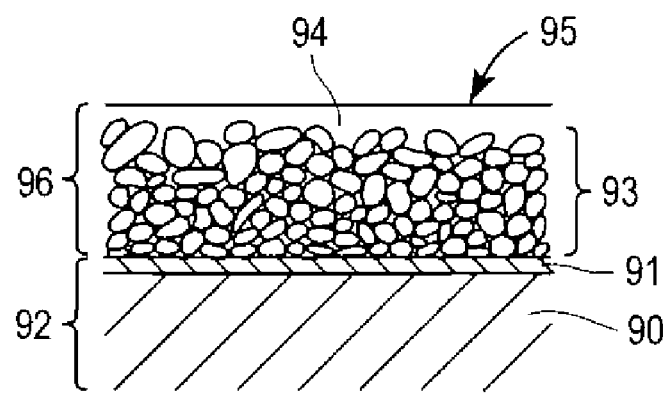
FIG. 9 shows an overall precursor layer with flat surface comprising a porous and rough precursor film and an electroplated layer deposited over it in a leveling fashion.

For example, FIG. 9 shows a metallic granular precursor layer 93 that may be formed on a base 92 by a nano-particle deposition approach such as spraying or doctor-blading of a Cu, or Cu—In, or Cu—Ga, or Cu—In—Ga containing nano particle ink. Nano particles in this case may be <200 nm in size and they may be dispersed in a solvent such as water, alcohol or ethylene glycol with the aid of well known organic surfactants and dispersing agents to form an ink. The granular precursor layer 93 may be in its as-deposited form or it may have been subjected to a treatment step such as an annealing step at an elevated temperature, such as at 100-400° C., for the purpose of at least partially fusing the nano particles to each other and to the contact film 91 of the base 92. Alternately the granular precursor layer 93, in general, may be any substantially metallic precursor layer with poor surface morphology and/or poor micro-scale compositional uniformity prepared by any method. For example the precursor layer may be obtained by first depositing on the base an ink of oxide particles comprising Cu, In and Ga to form an oxide film and then reducing the oxide film to obtain a substantially metallic film containing, for instance, more than 90 molar percent metallic components comprising Cu, In and Ga. As can be seen from this figure, the top surface of the granular precursor layer 93 is rough due to the granular nature of the nano particles or the heat treatment or reduction steps typically used to form the precursor layer. There are many gaps, which may be micron or sub-micron in size at or near the surface. As an example, the precursor layer may have a thickness of 200-2000 nm and its surface roughness maybe in the order of 50-500 nm. A Group IIIA-rich layer 94 is electrodeposited over the rough surface of the precursor layer 93 to form an overall precursor layer 96 with a surface 95 which is substantially free of roughness and porosity. For example, the surface 95 may have a roughness in the order of 5-10 nm. This is achieved because the plating solution has the capability to get into the smallest cavities or pores and then fill them up as described in relation with FIG. 8b. The precursor layer 93 may be Cu-rich, i.e. Cu/In, or Cu/Ga or Cu/(In+Ga) ratio is >1. In this case the Group IIIA-rich layer 94 may comprise In and/or Ga and may be plated out of electrolytes containing leveling or gap-filling additives. The Group IIIA-rich layer may also comprise a plurality of layers such as In and Ga layers. The thickness of the Group IIIA-rich layer is adjusted to yield an overall desired stoichiometry or composition for the overall precursor layer 96. Alternately, the precursor layer 93 may have a Cu/In or Cu/Ga or Cu/(In+Ga) ratio of 1 or <1. In this case a thinner Group IIIA-rich layer would be needed. The precursor layer 93 may also be substantially made of Cu particles. In this case In and/or Ga is electrodeposited on this rough and porous Cu layer to adjust the overall composition to a desired Cu/In, Cu/Ga or Cu/(In+Ga) ratio and at the same time fill in the pores and level the surface of the overall precursor layer for high quality compound film formation after reaction with at least one Group VIA material.

Figure 10:
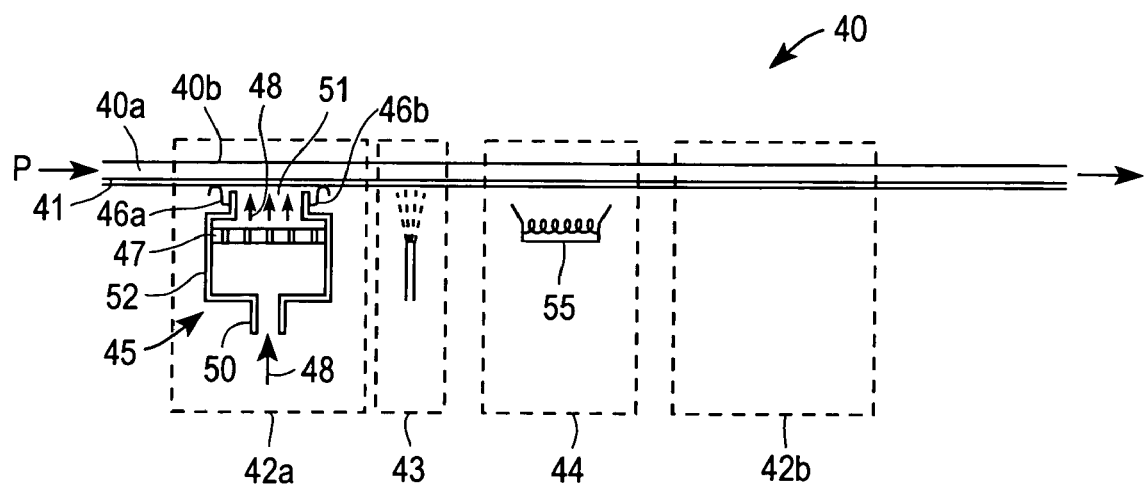
FIG. 10 shows an apparatus for electroplating, cleaning and annealing thin layers.

Schematic of an apparatus 40 that may be used for the electrodeposition steps of the present invention above-described processing steps is shown in FIG. 10. The apparatus will be described by taking as an example electrodeposition of Cu—Ga and In. It would be obvious to those skilled in the art that the general design of the apparatus of FIG. 10 may be used to practice all electroplating related embodiments of this invention. The apparatus 40 in FIG. 10 is an in-line system comprising multiple stations. The apparatus 40 processes a substrate 40a, which may be in the form of a flexible foil or a rigid sheet. Depositions are carried out on the conductor 41, which is previously coated on one face of the substrate 40a. First a Cu—Ga layer is deposited on the conductor 41 in the Cu—Ga electroplating station 42a. Copper-Ga electroplating station 42a comprises an electroplating cell 45, with an enclosure 52 that receives the electroplating solution through inlet 50 and delivers it onto the surface of the conductor 41 through opening 51. Electroplating solution flows in the direction shown by arrows 48. An anode 47 is placed into the enclosure 52, which is made of an insulating material such as polypropylene. The anode 47 may be made of an inert material such as Pt or Pt-coated Ti, or it may be a Cu or Cu—Ga alloy anode. The anode 47 may have pores or holes in it to allow the plating solution to flow through. Electrical contacts 46 are provided to softly touch the surface of the conductor 41. It should be noted that if the process is carried out in the in-line mode, the substrate 40a continuously moves in the direction "P" as the Cu—Ga layer is deposited. Therefore, while the first contact 46a touches the surface of the conductor 41 before plating, the second contact 46b touches the surface of the Cu—Ga layer that has just been deposited through the opening 51 onto the conductor 41. In that respect, scratching of the Cu—Ga surface by the second contact 46b should be avoided by using lightly touching, spring loaded or roller type contacts. It is also possible to use only one set of contacts (first contact 46a) eliminating the second contact 46b. Although two contacts are schematically shown in FIG. 4, it should be understood that any number of contact may be used as long as they are outside the area defined by the opening 51. If the substrate 40a is conductive, then electrical contacts may be made on the back surface 40b, eliminating any concerns about scratching the deposited layers.

During electrodeposition, a voltage is applied between the contacts 46 and the anode 47 to render the contacts and therefore the conductive surface of the substrate more cathodic. This causes deposition to take place on the conductive surface of the substrate. Plating solution is directed through the opening 51 onto the surface of the conductor 41 and then flows towards outside of the enclosure 52 to be collected, refurbished and re-circulated. The opening 51 may be in the form of a near-rectangular slit. The plating current density employed, the width of the slit in the direction P, and the speed of the substrate motion utilized determine the thickness of the Cu—Ga layer obtained on a portion of the substrate traveling above the opening 51. The length of the slit (in a direction perpendicular to P) determines how large a substrate is processed and the throughput of the apparatus 40. The width of the opening 51 or slit may be in the 1-10 cm range, whereas, its length may be in the range of 30-120 cm.

As the surface of the conductor 41 is coated with the Cu—Ga layer, it moves to a rinse/dry station 43 where the surface of the Cu—Ga layer is rinsed and cleaned off any chemical residues. After rinsing, the surface may be dried by blowing air or nitrogen over it. After rinsing and drying, the portion of the surface already coated with Cu—Ga moves into the anneal station 44. As described before, use of an anneal station 44 is optional but it is preferable to assure good compositional control. If the electrodeposition step carried out in the Cu—Ga electroplating station 42a yields a Cu—Ga layer that is fully alloyed, there may not be a need for an anneal station 44. In the anneal station 44 the freshly deposited Cu—Ga layer is exposed to heat originating from a heat source 55. The heat source 55 may be a resistive heating element, a bank of heating lamps, a laser beam etc. as described before. The Cu—Ga layer is annealed in the anneal station 44 to assure substantial alloying between Cu and Ga and formation of a Cu—Ga alloy layer. Once the Cu—Ga alloy layer is formed on the surface of the conductor 41, it moves into the In electroplating station 42b for the deposition of an In layer to obtain the precursor structure such as the one shown in FIG. 7 or 8b. The In electroplating station may be very similar to the Cu—Ga electroplating station and therefore its details have not been shown in FIG. 10. The anode in this case may be an inert anode or an In anode. The width of the opening, and the plating current density are selected to yield the desired In layer thickness and the desired overall Cu/(In+Ga) and Ga/(Ga+In) ratios. Since the preferred mode of operation for the apparatus 40 in FIG. 10 is "in-line", the speed of the substrate 40a in direction P is the same for all steps that are carried out in a serial mode. Therefore, thickness of various layers electroplated may be controlled by the plating current densities employed at each process station. It should be understood that various stages of the present invention may also be carried out in separate pieces of equipment. For example, Cu—Ga electroplating and annealing may be carried out in one apparatus and In electroplating may be carried out in a separate apparatus. Although four process stations are shown in FIG. 10, many numbers of process stations may be added to the apparatus of FIG. 10. For example, multiple Cu—Ga electroplating stations and In electroplating stations, and anneal stations may be employed to increase throughput. To practice the inventions described through FIGS. 6a-6d, two or more units shown in FIG. 10 may be added in series. Even selenization/sulfidation stations may be added at the end to react the freshly deposited Cu—Ga/In precursor stacks with Group VIA materials to form the compound layers as will be described later.

Figure 11A:
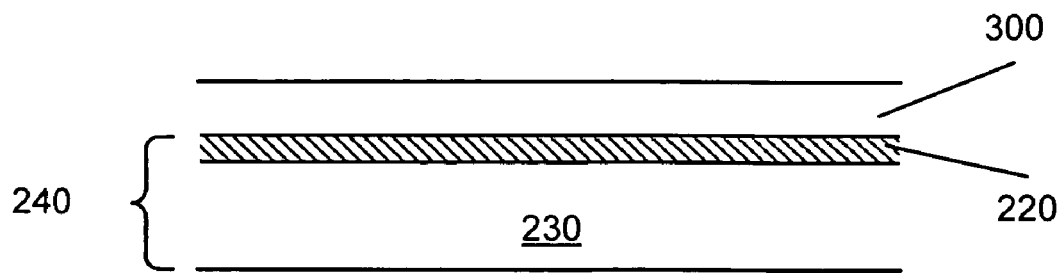
FIG. 11a shows a Cu layer deposited on a base.
Figure 11B:
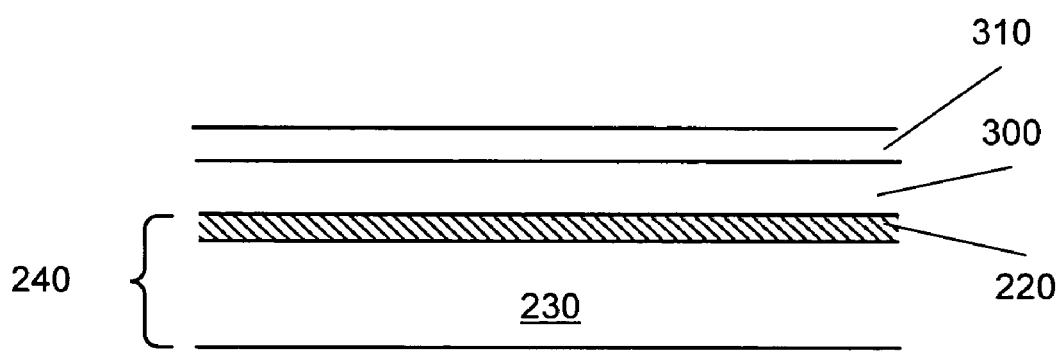
FIG. 11b shows a Cu/(Ga-bearing film) stack deposited on a base.
Figure 11C:
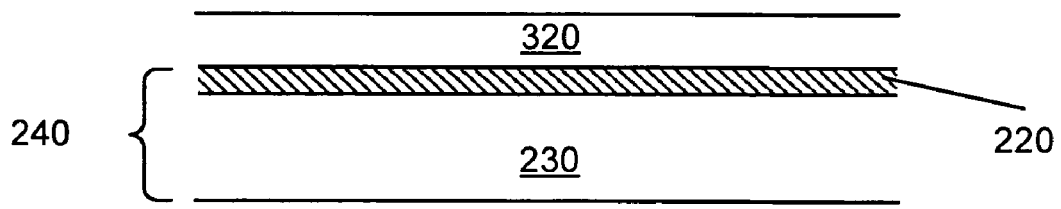
FIG. 11c shows the alloy layer formed on the base by reacting the stack of FIG. 11b.

In another preferred embodiment of the present invention a Cu—Ga alloy layer is formed by reacting a Cu layer with a Ga-bearing layer. FIG. 11a shows a base 240 coated with a Cu layer 300. The Cu layer 300 is preferably deposited on the conductor 220 through electrodeposition, although other well-known film deposition techniques may also be used. After deposition of the Cu layer 300, a Ga-bearing layer 310 is deposited over the Cu layer 300 as shown in FIG. 11b. The Ga-bearing layer is preferably a Ga layer but may also comprise a Ga—In alloy. The Ga-bearing layer is preferably deposited using electroplating, although other thin film deposition techniques may also be used. Since Ga and Ga—In alloys melt at low temperatures of <156° C., techniques such as melt spraying or dipping may also be utilized for deposition of these materials. In dipping techniques the substrate is dipped into and withdrawn from a melt which may be a melt of Ga or Ga and In. In this case a small amount of Cu (1-10%) may also be included in the melt to avoid leaching of the Cu from the electrodeposited Cu layer 300 into the melt. Once the stack of Cu layer 300 and the Ga-bearing layer 310 are formed as shown in FIG. 11b, the stack is annealed as described before to form a Cu—Ga alloy layer 320 as shown in FIG. 11c. The Cu—Ga alloy layer may also contain some In in the form of elemental In, or Cu—In alloys or In—Ga alloys, if the Ga-bearing layer 310 contains In. Atomic % of In in the Ga-bearing layer is preferably in the range of 0-20%. Thus the melting point of the Ga-bearing layer is preferably below 30° C. After the annealing step and formation of the Cu—Ga alloy layer 320, an In layer is deposited, preferably by electrodeposition, over the Cu—Ga layer to obtain a structure similar to the one in FIG. 7. A preferred process flow of this invention which uses low-cost, large area deposition approaches is; a) electrodeposition of a Cu layer on a base, b) electrodeposition of a Ga layer over the Cu layer, c) annealing of the Cu/Ga stack to form a Cu—Ga alloy layer, and d) electrodeposition of an In layer over the Cu—Ga alloy layer to form a precursor layer as shown in FIG. 7. The apparatus of FIG. 10 may be easily configured to carry out these process steps. Electrodeposition of In from electrolytes with leveling ability addresses any roughness and micro-scale compositional non-uniformity issues that may be present in the Cu—Ga alloy layer as described before in relation with FIGS. 8a and 8b.

Reaction of metallic precursors with Group VIA materials may be achieved various ways. In one embodiment the precursor layer is exposed to Group VIA vapors at elevated temperatures. These techniques are well known in the field and they involve heating the precursor layer to a temperature range of 350-600° C. in the presence of at least one of Se vapors, S vapors, and Te vapors provided by sources such as solid Se, solid S, solid Te, $H_2Se$ gas, $H_2S$ gas etc. for periods ranging from 5 minutes to 1 hour. In another embodiment a layer or multi layers of Group VIA materials are deposited on the precursor layer and the stacked layers are then heated up in a furnace or in a rapid thermal annealing furnace and like. Group VIA materials may be evaporated on, sputtered on or plated on the precursor layer. Alternately inks comprising Group VIA nano particles may be prepared and these inks may be deposited on the precursor layers to form a Group VIA material layer comprising Group VIA nano particles. Dipping, spraying, doctor-blading or ink writing techniques may be employed to deposit such layers. Reaction may be carried out at elevated temperatures for times ranging from 1 minute to 30 minutes depending upon the temperature. As a result of reaction, the Group IBIIIAVIA compound is formed from the precursor. It should be noted that reaction chambers may be added to the apparatus of FIG. 10 to carry out the whole process in-line.

Solar cells may be fabricated on the compound layers of the present invention using materials and methods well known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art.

I claim:

1. A method of growing a Group IBIIIAVIA semiconductor layer on a base comprising;
depositing on the base a film of Group IB material and at least one layer of Group IIIA material, both the film and the at least one layer having no substantial amount of a Group VIA material therein;

intermixing the film of Group IB material and the at least one layer of Group IIIA material to form an intermixed layer that has no substantial amount of a Group VIA material; and forming over the intermixed layer a metallic film comprising at least one of a Group IIIA material sub-layer and a Group IB material sub-layer; and reacting the intermixed layer and the metallic film with a Group VIA material to grow the Group IBIIIAVIA semiconductor layer.

2. The method according to claim 1 wherein the step of forming the metallic film over the intermixed layer includes the steps of forming a first Group IIIA material layer and a separate Group IIIA material layer as the Group IIIA material sub-layer.

3. The method according to claim 1 wherein the step of intermixing includes a step of heating the film of Group IB material and the at least one layer of Group IIIA material to a temperature in the range of 50-350 degrees Celsius.

4. The method according to claim 3, wherein the step of heating is carried out for a period of 2-600 seconds, and the intermixed layer is substantially alloyed throughout, thereby achieving substantially uniform micro-scale composition.

5. The method according to claim 1 wherein the at least one layer of Group IIIA material has a thickness that substantially prevents balling phenomenon in the intermixed layer.

6. The method according to claim 5 wherein the molar ratio of Group IB material to Group IIIA material in the intermixed layer is larger than 1.0.

7. The method according to claim 1 further including a step of annealing the intermixed layer and the metallic film after the step of forming, to produce an annealed layer.

8. The method according to claim 7 wherein the step of annealing is carried out at a temperature of 50-350 degrees Celsius.

9. The method according to claim 7 further repeating the steps of depositing, intermixing, forming and annealing at least once to form a precursor layer.

10. The method according to claim 1 wherein the steps of depositing and forming are each performed using electrodeposition and the Group VIA material includes at least one of selenium and sulfur.

11. The method according to claim 1 wherein the steps of depositing and forming are each performed using electrodeposition.

12. A method of growing a Cu (In,Ga) (Se,S)$_2$ semiconductor layer on a base comprising;

depositing on the base a film of copper and at least one of a layer of indium and a layer of gallium, both the film and the at least one layer having no substantial amount of a Group VIA material therein;

intermixing the film of copper and the at least one of the layer of indium and the layer of gallium to form an intermixed layer that has no substantial amount of a Group VIA material; and forming over the intermixed layer a metallic film comprising at least one of an indium sub-layer, a gallium sub-layer and a copper sub-layer; and reacting the intermixed layer and the metallic film with a Group VIA material to grow the Group IBIIIAVIA semiconductor layer.

13. The method according to claim 12 wherein the step of intermixing includes a step of heating the film of copper and the at least one of the layer of indium and the layer of gallium to a temperature in the range of 50-350 degrees Celsius.

14. The method according to claim 13, wherein the step of heating is carried out for a period of 2-600 seconds, and the intermixed layer is substantially alloyed throughout, thereby achieving substantially uniform micro-scale composition.

15. The method according to claim 14 wherein the molar ratio of copper to indium plus gallium in the intermixed layer is larger than 1.0.

16. The method according to claim 14 wherein each of the steps of depositing and forming are performed using electrodeposition.

17. The method according to claim 12 wherein the step of depositing deposits on the base the film of copper, and both the layer of indium and the layer of gallium, and wherein the step of intermixing intermixes the film of copper, the layer of indium and the layer of gallium to form the intermixed layer.

18. The method according to claim 17 wherein the metallic film comprises the indium sub-layer and the gallium sub-layer and the copper sub-layer.

19. The method according to claim 18 wherein the step of reacting the intermixed layer and the metallic film reacts the intermixed layer and the metallic film with at least one of sulfur and selenium to grow the Cu (In,Ga) (Se,S)$_2$ semiconductor layer.

20. The method according to claim 12 wherein the metallic film comprises the indium sub-layer and the gallium sub-layer and the copper sub-layer.

21. The method according to claim 12 wherein the step of reacting the intermixed layer and the metallic film reacts the intermixed layer and the metallic film with at least one of sulfur and selenium to grow the Cu (In,Ga) (Se,S)$_2$ semiconductor layer.

22. The method according to claim 12 wherein the step of depositing deposits on the base the film of copper and the layer of indium.

23. The method according to claim 22 wherein the molar ratio of copper to indium in the intermixed layer is larger than or equal to 1.22.

24. The method according to claim 22 wherein the metallic film comprises the gallium sub-layer.

25. The method according to claim 24 wherein the step of reacting the intermixed layer and the metallic film reacts the intermixed layer and the metallic film with at least one of sulfur and selenium to grow the Cu (In,Ga) (Se,S)$_2$ semiconductor layer.

26. The method according to claim 24 wherein the film of copper, the layer of indium and the gallium sub-layer are electrodeposited.

27. The method according to 22 wherein the metallic film comprises the copper sub-layer and the gallium sub-layer.

28. The method according to 27 wherein the molar ratio of copper to indium in the intermixed layer is 1.22 and the molar ratio of copper to gallium in the metallic film is 0.5.

29. The method according to claim 28 wherein the step of reacting the intermixed layer and the metallic film reacts the intermixed layer and the metallic film with at least one of sulfur and selenium to grow the Cu (In,Ga) (Se,S)$_2$ semiconductor layer.

30. The method according to claim 12 wherein the step of depositing deposits on the base the film of copper and the layer of gallium.

31. The method according to claim 30 wherein the molar ratio of copper to gallium in the intermixed layer is larger than or equal to 1.

32. The method according to claim 30 wherein the metallic film comprises the indium sub-layer.

33. The method according to claim 32 wherein the step of reacting the intermixed layer and the metallic film reacts the intermixed layer and the metallic film with at least one of sulfur and selenium to grow the Cu (In,Ga) (Se,S)$_2$ semiconductor layer.

34. The method according to claim 32 wherein the film of copper, the layer of gallium and the indium sub-layer are electrodeposited.

35. The method according to claim 12 wherein each of the steps of depositing and forming are performed using electrodeposition.

* * * * *